United States Patent
Klapper

(10) Patent No.: US 10,353,002 B2
(45) Date of Patent: Jul. 16, 2019

(54) TEST SYSTEM AND METHOD FOR TESTING A CIRCUIT BREAKER

(71) Applicant: OMICRON ELECTRONICS GMBH, Klaus (AT)

(72) Inventor: Ulrich Klapper, Rankweil (AT)

(73) Assignee: OMICRON ELECTRONICS GmbH, Klaus (AT)

( * ) Notice: Subject to any disclaimer, the term of this patent is extended or adjusted under 35 U.S.C. 154(b) by 194 days.

(21) Appl. No.: 15/319,284

(22) PCT Filed: Aug. 12, 2015

(86) PCT No.: PCT/EP2015/068531
§ 371 (c)(1),
(2) Date: Dec. 15, 2016

(87) PCT Pub. No.: WO2016/023941
PCT Pub. Date: Feb. 18, 2016

(65) Prior Publication Data
US 2017/0139009 A1 May 18, 2017

(30) Foreign Application Priority Data

Aug. 12, 2014 (AT) .............. A 50561/2014

(51) Int. Cl.
*G01R 31/327* (2006.01)
(52) U.S. Cl.
CPC ................. *G01R 31/3272* (2013.01)
(58) Field of Classification Search
CPC ..................................... G01R 31/327

USPC ......................... 324/424, 415, 416
See application file for complete search history.

(56) References Cited

U.S. PATENT DOCUMENTS

| 5,065,101 | A | 11/1991 | Ledbetter |
| 5,272,438 | A | 12/1993 | Stumme |
| 5,650,907 | A * | 7/1997 | Ishii ................ H02H 1/0007 324/509 |

(Continued)

FOREIGN PATENT DOCUMENTS

| CN | 1349105 A | 5/2002 |
| CN | 201255765 Y | 6/2009 |
| CN | 201293823 Y | 8/2009 |

OTHER PUBLICATIONS

"CIBANO 500 3-in 1 test system for medium-and high-voltage circuit breakers", Omicron—dated Jul. 7, 2014, pp. 1-20.

(Continued)

*Primary Examiner* — Giovanni Astacio-Oquendo
(74) *Attorney, Agent, or Firm* — Mintz Levin Cohn Ferris Glovsky and Popeo, P.C.; Peter F. Corless; Steven M. Jensen

(57) ABSTRACT

The invention relates to a test system and a method to test a circuit breaker (2) of an electrical switchgear assembly. A sub-station battery (3) of the electrical switchgear assembly is used to generate a supply voltage (7) for the circuit breaker (2) for the testing thereof, wherein the sub-station battery (3) is coupled to a test device (1) in order to generate the supply voltage (7) for the circuit breaker (7) [sic] from an input voltage (6) provided by the sub-station battery (3). The supply voltage (7) is stabilized by means of a voltage regulator (11) of the test device (1).

11 Claims, 2 Drawing Sheets

(56) References Cited

U.S. PATENT DOCUMENTS

| | | | | |
|---|---|---|---|---|
| 5,691,518 A | * | 11/1997 | Jones | H02B 11/133 |
| | | | | 200/50.21 |
| 6,066,814 A | * | 5/2000 | Smith | H01H 9/22 |
| | | | | 200/50.22 |
| 6,179,637 B1 | * | 1/2001 | Lee | H02B 11/12 |
| | | | | 439/248 |
| 6,545,479 B1 | | 4/2003 | Dollar, II et al. | |
| 6,617,972 B2 | * | 9/2003 | Takarada | G08B 21/0484 |
| | | | | 324/538 |
| 8,779,729 B2 | * | 7/2014 | Shiraishi | G06F 1/3212 |
| | | | | 320/155 |
| 2006/0001410 A1 | * | 1/2006 | Ishikawa | H02M 3/1588 |
| | | | | 323/282 |
| 2009/0021078 A1 | * | 1/2009 | Corhodzic | G06F 1/263 |
| | | | | 307/67 |
| 2011/0260702 A1 | * | 10/2011 | Enenkel | H02M 3/07 |
| | | | | 323/234 |
| 2012/0098518 A1 | * | 4/2012 | Unagami | G01R 22/066 |
| | | | | 324/74 |

OTHER PUBLICATIONS

Chinese Office Action received in corresponding Chinese Application No. 2015800317334, dated Oct. 8, 2018.

\* cited by examiner

TEST SYSTEM AND METHOD FOR TESTING A CIRCUIT BREAKER

This application is a national Phase application filed under 35 U.S.C. § 371 of PCT International Application No. PCT/EP2015/068531 with an International Filing Date of Aug. 12, 2015, which claims under 35 U.S.C. § 119(a) the benefit of Austrian Application No. A50561/2014, filed Aug. 12, 2014, the entire contents of which are incorporated herein by reference.

The present invention relates to a test system and to a method for testing a circuit breaker of an electrical switchgear assembly.

There are a number of types of test devices for testing different types of switches which are operated in the low, medium and high voltage range. An example for switches of this type are circuit breakers.

Circuit breakers are special switches which are designed for high currents. In power engineering plants, such as for example energy generation plants such as power plants or energy transfer plants, circuit breakers do not only switch operating currents, but also switch overload currents or short-circuit currents in the event of failures. Circuit breakers can be used both for switching on these currents and for switching off the currents. A circuit breaker usually comprises a switch contact and a control drive which mechanically drives the switch contact. The control drive can, for example, comprise spring drives or air pressure drives which store mechanical energy that is used for quickly switching the switch contact. The spring or air pressure drives can for example be preloaded or "charged" with electrical drives. The release of the stored mechanical energy for switching the switch contact can be carried out via so-called trip coils which are electrically actuated. In electrical installations there is usually a sub-station battery which provides a direct voltage (DC voltage) of between 48 and 220 V in order to supply the trip coils with energy. Only one potential-free relay contact is then required in order to open or close. During operation, the commands for opening or closing usually come from protection relays or the control system.

In the context of the present invention, load switch, isolator or earthing switch are also understood by the term, "circuit breaker".

Circuit breakers are central components in electrical switchgear assemblies and must therefore be serviced at regular intervals and tested in order to be able to ensure the faultless operation thereof.

During normal operation, parts of the circuit breakers are often connected to a sub-station battery of the corresponding switchgear assembly which supplies the circuit breakers with the required energy and thus ensures that the circuit breakers fulfil their envisaged function. If a circuit breaker is tested, the circuit breaker has to be supplied with energy at least briefly during the test in order, on the one hand, to charge or recharge built-in energy storage systems, for example springs or compressed gas and, on the other hand, to release the stored energy in order to effectively activate the circuit breaker. Under certain conditions, in particular in the case of isolators, work can be carried out without energy storage systems. In this case, the energy has to be supplied externally when the switch is actuated.

Test systems can also traditionally be used which generate the required supply voltage from the mains voltage themselves. The advantage of this is that the voltage can be varied and tests can therefore be performed below and above the mains voltage of the sub-station battery. So-called undervoltage tests in particular allow for a good assessment of whether the circuit breaker would still operate even with a low battery.

A further possibility consists of using the sub-station battery directly to supply the circuit breaker to be tested during the test. In this case, the behaviour of the circuit breaker cannot be tested in the case of an undervoltage. However, it is possible to loop in a resistor between sub-station battery and circuit breaker. A part of the voltage thus drops at the resistor and an undervoltage develops at the circuit breaker. The supply voltage in this case depends on the current flow and can thus strongly fluctuate which may negatively affect the quality of the measurement.

The object of the present invention is thus to provide a test system and a method for testing circuit breakers by means of which the previously described problems can be avoided.

According to the invention, this object is achieved by means of a test system for testing a circuit breaker of an electrical switchgear assembly according to claim 1, a test device according to claim 10 and a test method according to claim 11. The dependent claims define further embodiments of the present invention.

According to the invention, a test system for a circuit breaker of an electrical switchgear assembly is provided which comprises a test device wherein the energy for actuating the circuit breaker is taken from a sub-station battery of the electrical switchgear assembly which preferably serves as the voltage supply of the circuit breaker during the normal operation of the circuit breaker and is stabilised by means of a voltage regulator of the test device. In the context of the present invention, load switch, isolator or earthing switch are understood by the term "circuit breaker".

The advantage of this arrangement is that in order to test the circuit breaker it is thus not necessary to provide a separate voltage source for the generation of the test or supply voltage for the circuit breaker since the sub-station battery already present at the location of the circuit breaker can be used as the voltage source. Possible voltage fluctuations of the sub-station battery can be regulated by means of the voltage regulator of the test device such that a supply voltage that is maintained constant and is as independent as possible from the load current is provided for the load switch at the outlet of the test device. Alternatively, another voltage source can also be used instead of the sub-station battery of the electrical switchgear assembly which is in any case present at the location of the testing of the circuit breaker.

Furthermore, the test device can comprise switching means, for example in the form of a trip contact which selectively actuate a trip coil of the circuit breaker with supply voltage if it is closed.

In spite of connection to the sub-station battery for supplying the trip coil(s) of the circuit breaker, the test device can comprise a conventional mains connection by means of which for example the control logic or the measurement electronics is supplied. Optionally however the connection to the sub-station battery can be the only supply for the test device.

During the testing of the circuit breaker, a measuring unit of the test device preferably receives measurement signals from the circuit breaker and evaluates them in order to be able to thus assess the trip behaviour of the circuit breaker or the response thereof to the applied supply voltage.

The circuit breaker to be tested can comprise switching means for example in the form of a main contact which are connected to the trip coil. If the trip coil is actuated with the supply voltage as described above, these switching means can be tripped depending on the size of the supply voltage.

The input voltage provided by the sub-station battery can have a nominal voltage which is not variable and has a constant value. In some embodiments of the present invention, it is therefore desirable to change the value of the input voltage in order to apply different test scenarios using different trip voltages on the circuit breaker. To this end, different embodiments of voltage regulators can advantageously be used.

In one exemplary embodiment, the voltage regulation can be achieved by means of a linear voltage regulator. This embodiment is applicable to cases where the supply voltage is lower than the input voltage. The advantage of this arrangement is that undervoltages and the associated behaviour of the circuit breaker can be tested.

In a further preferred exemplary embodiment, a switched voltage regulator can be used, wherein a lower supply voltage can be generated by means of suitable power electronics and the power loss is simultaneously minimised. As a result, the input current may also be smaller than the current, by means of which the test device actuates the circuit breaker, depending on the voltage difference between the input voltage and the supply voltage.

Furthermore, the voltage regulator may also be a step-down converter. The output current of the step-down converter is higher than the medium input current thereof and the output voltage is lower than the input voltage. As a result, when using a step-down converter in the test device, this embodiment can be applied to cases where the supply voltage of the test device is less than or equal to the input voltage.

In a further exemplary embodiment, the voltage regulator can also be a step-up converter. In this case, the output voltage of the step-up converter is greater than the input voltage. When using a step-up converter, the supply voltage of the test device is thus greater than or equal to the input voltage provided by the sub-station battery. An advantage of using a step-up converter is being able to also test voltages on the circuit breaker, which are higher than the voltage of the external voltage source or the sub-station battery.

Furthermore, a combination of step-up converter and step-down converter can also be selected in order to implement the voltage regulator. The advantage of this arrangement is that the voltage range of the output of the test device can then be freely selected and both undervoltage and overvoltage tests can be performed. So-called undervoltage tests in particular allow for an efficient assessment of whether the circuit breaker is operating correctly even with a low battery.

In the case of all proposed embodiments of the voltage regulator, when the test voltage, i.e. the supply voltage for the respective circuit breaker is generated, said voltage can be advantageously stabilised by the voltage regulator in order to balance out and to compensate fluctuations in the input voltage delivered by the sub-station battery. As a result, a test of the circuit breaker can be carried out with greater quality and accuracy.

In the context of the present invention, a test device for testing a circuit breaker of an electrical switchgear assembly is also provided, which is designed to generate a supply voltage for the testing of the circuit breaker from a voltage of a sub-station battery of the electrical switchgear assembly, wherein the test device comprises a voltage regulator for stabilising the supply voltage. The test device can preferably be designed as previously described.

Moreover, the invention comprises a method for performing a test of a circuit breaker of an electrical switchgear assembly, where a test device is coupled to a sub-station battery of the electrical switchgear assembly in order to apply an input voltage from the sub-station battery to the test device. The test device is coupled to the circuit breaker to be tested and the supply voltage for the circuit breaker is generated from the voltage of the sub-station battery to test the circuit breaker, wherein the supply voltage is stabilised by means of a voltage regulator of the test device. The behaviour of the circuit breaker when the supply voltage is applied is recorded and analysed by means of a measuring unit of the test device.

Embodiments according to the invention are described in detail below with reference to the drawing.

Figure 1:
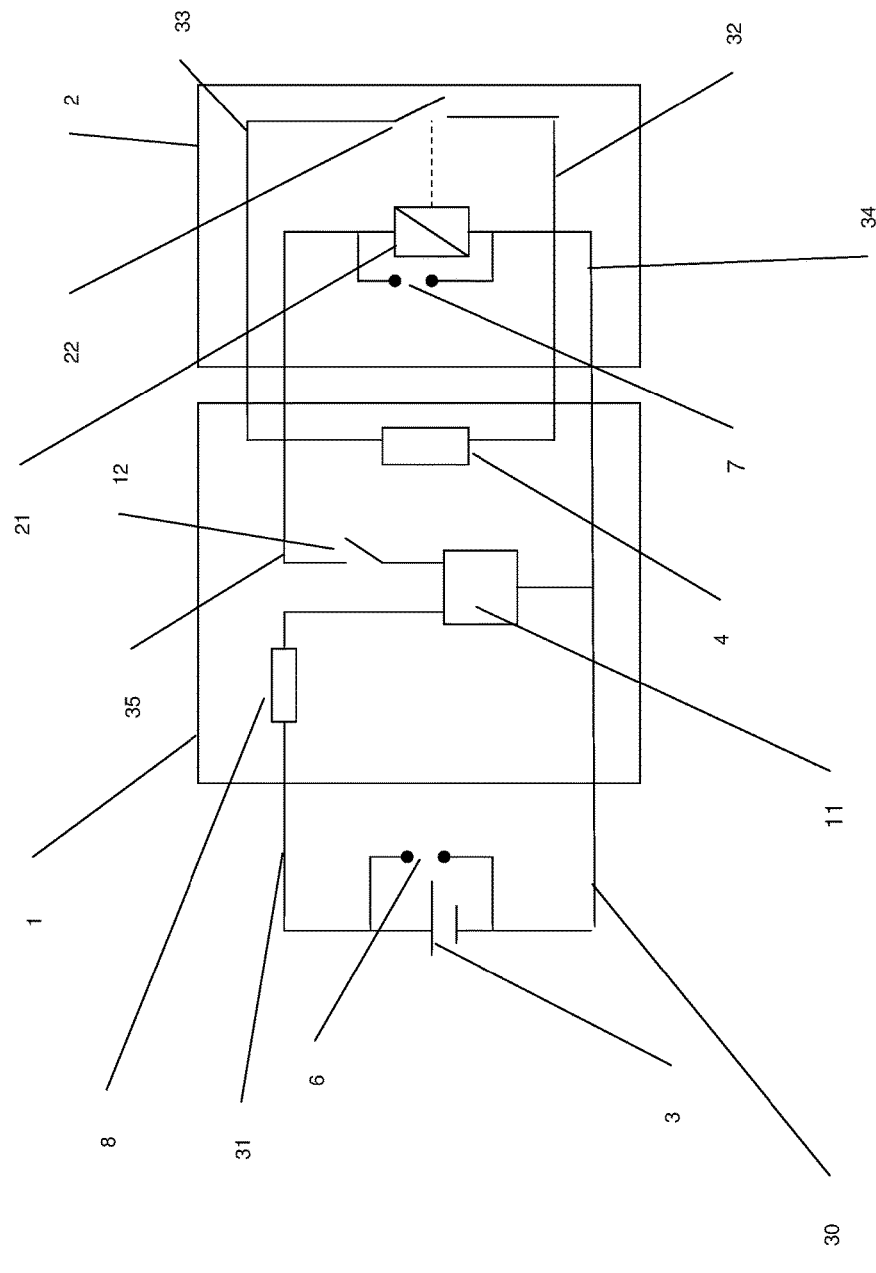
FIG. 1 shows a test system according to an embodiment of the present invention.

FIG. 1 shows a test system which comprises a test device 1 for testing a circuit breaker 2. The circuit breaker 2 is a component of an electrical switchgear assembly which also comprises a sub-station battery 3 which supplies the circuit breaker 2 with an operating voltage during normal operation. The test device 1 can be temporarily installed in the switchgear assembly for the purpose of testing the circuit breaker 2.

The sub-station battery generally provides a direct voltage which may be in the range of 48 V to 220 V in some exemplary embodiments. In FIG. 1, this voltage is denoted as the input voltage 6.

In order to test the circuit breaker 2, the test device 1 is connected between the sub-station battery 3 and the circuit breaker 2. In this regard, the test device 1 is connected via connections 30 and 31 to the sub-station battery 3 in such a way that the test device 1 is supplied with the input voltage 6. In the case of the embodiment illustrated, the test device 1 comprises, amongst other things, a voltage regulator 11, a switch in the form of a trip contact 12 and a measuring unit 4. In addition, in one exemplary embodiment, the test device may comprise a resistor 8 that is variable and/or can be looped in order to correspondingly adapt the input voltage of the test device 1. The input voltage 6 is applied to the voltage regulator 11, wherein the resistor 8 can be looped in between the sub-station battery 3 and the voltage regulator 11. The voltage regulator 11 is connected via connections 34 and 35 to the circuit breaker 2. In this regard, the connection 35 comprises a switch in the form of a trip contact 12 by means of which the circuit, which is defined by the connections 34 and 35, can be optionally opened or closed. A measuring unit 4 of the test device 1 is coupled via connections 32 and 33 to the circuit breaker 2.

A supply voltage 7 for testing the circuit breaker 2 is generated by the test device 1 from the input voltage 6 provided by the sub-station battery 3. The voltage regulator 11 is advantageously designed such that it stabilises the supply voltage 7 for the circuit breaker 2 and balances out or also specifically decreases or increases possible fluctuations which may occur in the voltage 6 provided by the sub-station battery 3. In this regard, the voltage regulator 11 can be implemented in different embodiments.

For example, the voltage regulator 11 can be a linear voltage regulator. This voltage regulator is characterised in that it provides only such supply voltages 7 that are smaller than the input voltage 6. In this regard, the current which is generated by the input voltage 6 of the sub-station battery 3 is greater than or equal to the current by means of which the test device 1 actuates the circuit breaker 2. The differential voltage between the input voltage 6 and the supply voltage 7 multiplied by the current is converted into heat in the test device 1.

In a further exemplary embodiment, the voltage regulator 11 may be a switched voltage regulator which is equipped with suitable power electronics. In this case, a supply voltage 7 is also provided which is lower than the input voltage 6, wherein however the power loss can be kept low. In addition, depending on the voltage differential between input voltage 6 and supply voltage 7, the current which is generated by the input voltage 6 of the sub-station battery 3 may be smaller than the current by means of which the test device 1 actuates the circuit breaker 2.

Furthermore, the voltage regulator 11 may also be a step-down converter. The supply voltage 7 is in this case less than or equal to the input voltage 6. In a further possible exemplary embodiment, the voltage regulator 11 may also be a step-up converter. In this case, the supply voltage 7 is greater than or equal to the input voltage 6. However, it is also possible to select a combination of step-up and step-down converter for the voltage regulator 11, wherein the supply voltage 7 can then be freely selected.

By means of a suitable selection of the type of voltage regulator 11, the test system can thus be adapted to the respectively present test conditions, wherein in particular the magnitude of the supply voltage 7 can be correspondingly variably selected.

The trip contact 12 shown in FIG. 1 serves to optionally open or close the circuit, which is defined by the connections 34 and 35, and to apply the supply voltage 6, which is provided by the voltage regulator 11, to a trip coil 21 of the circuit breaker 2 to be tested via the connections 34 and 35. If the trip contact 12 is closed, the supply voltage 7 is applied to the trip coil 21 by means of which the trip coil 21 can be actuated. Depending on the magnitude of the voltage 7 applied to the coil 21, the trip coil 21 opens or closes a main contact 22 of the circuit breaker 2 rapidly, less rapidly or does not open or close it at all.

The measuring unit 4 of the test device 1 receives measuring signals of the circuit breaker 2 by means of which the measuring unit 4 can automatically carry out an assessment of the trip behaviour of the circuit breaker 2 or the main contact 22 thereof.

Figure 2:
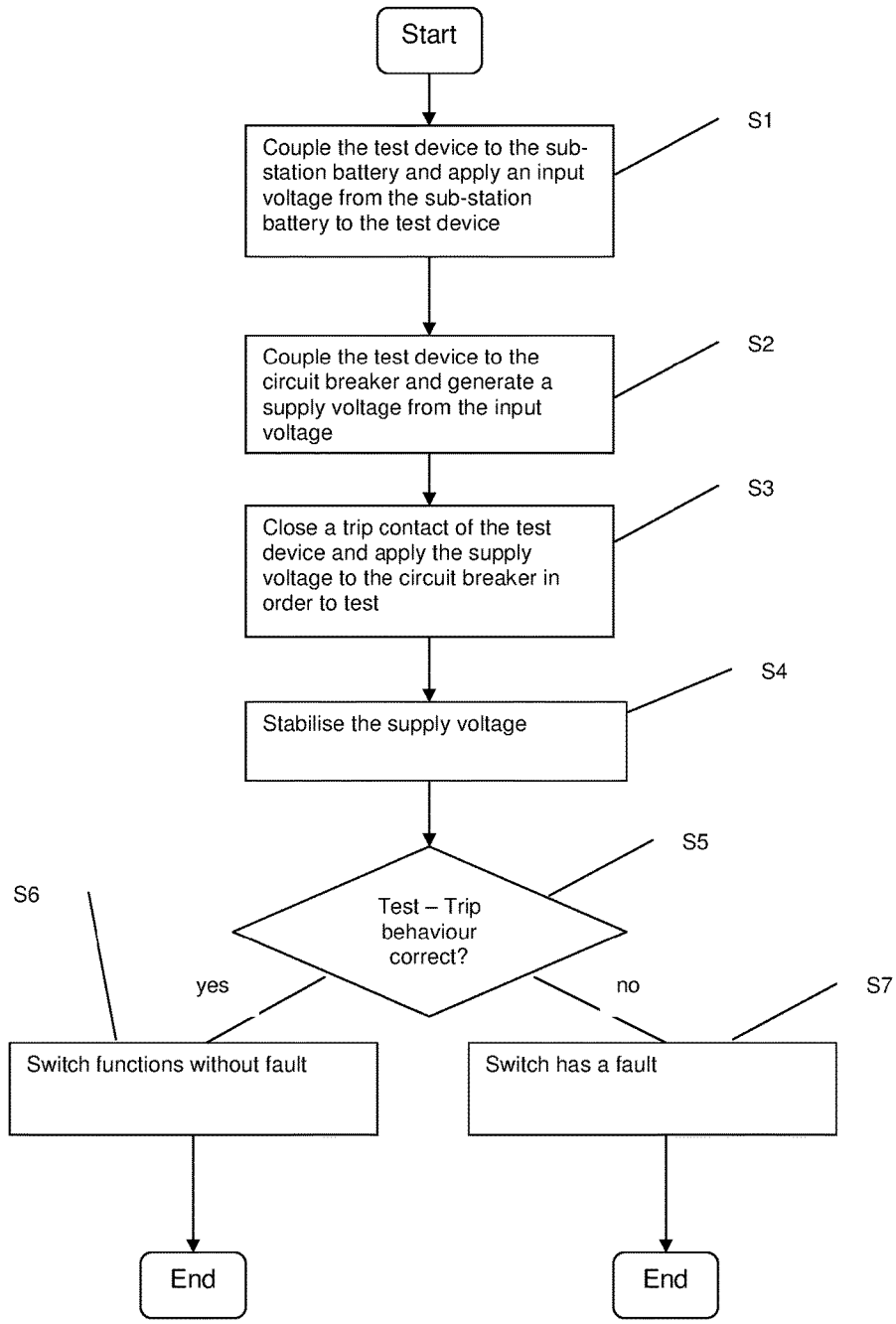
FIG. 2 shows an illustration of a method for testing a circuit breaker with the proposed test system.

FIG. 2 shows an illustration to explain a method for testing a circuit breaker according to the present invention. In this regard, in a first step S1, the test device is coupled to the sub-station battery of the electrical switchgear assembly in order to thus apply a voltage of the sub-station battery to the test device as an input voltage.

In a next step S2, the test device is coupled to the circuit breaker to be tested, wherein the test device generates a supply voltage to test the circuit breaker from the voltage of the sub-station battery.

In a further step S3, the trip contact of the test device is closed and thus applies the supply voltage to the circuit breaker to be tested. During the testing of the trip behaviour of the circuit breaker, in a step S4, the supply voltage is stabilised with the voltage regulator of the test device such that a constant test voltage can be supplied to the circuit breaker without fluctuations.

Depending on the respectively selected value of the supply voltage, the circuit breaker to be tested is tripped rapidly, less rapidly or is not tripped. In an advantageous embodiment, the selection of the supply voltage can be devised such that it is below a determined threshold value. In this case, the circuit breaker is not tripped in the event of faultless operation. In a further embodiment, the supply voltage can be selected such that it is above the determined threshold value such that the circuit breaker trips in the event of faultless operation. In a step S5, the measuring unit of the test device therefore tests whether the circuit breaker has the correct trip behaviour corresponding to the respectively selected supply voltage.

If the trip behaviour is correct, it is determined in a step S6 that the circuit breaker trips faultlessly. If the trip behaviour is not correct, it is, however, determined in a step S7 that the circuit breaker has a fault.

The invention claimed is:

1. Test system for testing a circuit breaker of an electrical switchgear assembly, comprising:
   a sub-station battery of the electrical switchgear assembly and
   a test device which can be coupled to the sub-station battery and to the circuit breaker and is designed to generate a supply voltage for the circuit breaker from a voltage of the sub-station battery, wherein the test device comprises a voltage regulator which is designed to stabilize the supply voltage of the circuit breaker,
   wherein the test device comprises a measuring unit which is designed to analyze a trip behavior of the circuit breaker when the supply voltage is applied.

2. The test system according to claim 1, wherein the test device comprises switching means which are designed to selectively apply the supply voltage to a trip coil of the circuit breaker.

3. The test system according to claim 1, wherein the measuring unit is designed to receive and evaluate measuring signals from the circuit breaker.

4. The test system according to claim 1, wherein the circuit breaker comprises a switching device and a trip coil, wherein the trip coil is supplied with the supply voltage from the test device and the switching device of the circuit breaker can be activated by the trip coil.

5. The test system according to claim 1, wherein the voltage regulator is a linear voltage regulator.

6. The test system according to claim 1, wherein the voltage regulator is a switched voltage regulator.

7. The test system according to claim 1, wherein the voltage regulator is a step-down converter.

8. The test system according to claim 1, wherein the voltage regulator is a step-up converter.

9. The test system according to claim 1, wherein the voltage regulator is a combined step-down converter and step-up converter.

10. Method for testing a circuit breaker of an electrical switchgear assembly, comprising the following steps:
    coupling a test device to a sub-station battery of the electrical switchgear assembly and applying a voltage from the sub-station battery to the test device,
    coupling the test device to the circuit breaker and generating a supply voltage for the circuit breaker from the voltage of the sub-station battery in order to test the circuit breaker,
    stabilizing the supply voltage by means of a voltage regulator of the test device, and
    analyzing a trip behavior of the circuit breaker with a measuring unit of the test device when the supply voltage is applied.

11. The method according to claim 10, wherein a test system is used in order to test the circuit breaker, the test system comprising:
    a sub-station battery of the electrical switchgear assembly and a test device which can be coupled to the sub-station battery and to the circuit breaker and is designed to generate a supply voltage for the circuit breaker from a voltage of the sub-station battery, wherein the test device comprises a voltage regulator which is designed to stabilize the supply voltage of the circuit breaker.

\* \* \* \* \*